United States Patent [19]

Matsuzaki et al.

[11] Patent Number: 5,157,470
[45] Date of Patent: Oct. 20, 1992

[54] THIN FILM TRANSISTOR, MANUFACTURING METHOD THEREOF AND MATRIX CIRCUIT BOARD AND IMAGE DISPLAY DEVICE EACH USING THE SAME

[75] Inventors: Eiji Matsuzaki; Takao Takano; Toshiyuki Koshita; Yoshifumi Yoritomi, all of Yokohama; Akihiro Kenmotsu, Fujisawa, all of Japan

[73] Assignee: Hitachi, Ltd., Tokyo, Japan

[21] Appl. No.: 704,855

[22] Filed: May 21, 1991

Related U.S. Application Data

[63] Continuation of Ser. No. 479,173, Feb. 13, 1990, abandoned.

[30] Foreign Application Priority Data

Feb. 27, 1989 [JP] Japan ................................ 1-43028

[51] Int. Cl.$^5$ ..................... H01L 27/01; H01L 27/13; H01L 29/78
[52] U.S. Cl. ..................... 357/23.7; 357/4; 357/45; 357/52; 359/55; 359/59
[58] Field of Search ..................... 357/23.7, 4, 45, 52; 359/54, 55, 59

[56] References Cited

U.S. PATENT DOCUMENTS

| | | | |
|---|---|---|---|
| 4,752,814 | 6/1988 | Tuan | 357/23.7 |
| 4,767,723 | 8/1988 | Hinsberg, III et al. | 357/23.7 |
| 4,885,616 | 12/1989 | Ohta | 357/23.7 |
| 4,888,632 | 12/1989 | Haller | 357/23.7 |
| 4,933,296 | 6/1990 | Parks et al. | 357/23.7 |

FOREIGN PATENT DOCUMENTS 63-79381 4/1988 Japan ................................ 357/23.7

Primary Examiner—Andrew J. James
Assistant Examiner—Ngan Van Ngo
Attorney, Agent, or Firm—Antonelli, Terry, Stout & Kraus

[57] ABSTRACT

Disclosed are a thin film transistor comprising a first electrode pattern formed on an insulating substrate as a gate electrode, a first insulating film formed as a gate insulating film and covering at least the electrode pattern, a semiconductor thin film pattern mainly composed of silicon formed on the insulating film, the semiconductor thin film pattern overlapping the first electrode pattern and the existing region thereof being limited, second and third electrodes formed on the semiconductor thin film pattern as a drain electrode and a source electrode, the second and third electrodes covering a portion of the semiconductor thin film pattern and being spaced apart each other, and a thin film containing silicon oxide formed over the semiconductor film, the second and third electrodes being formed upon the silicon oxide film, a method of manufacturing the thin film transistor, an active matrix circuit board using the thin film transistors, and an image display device using the active matrix circuit board.

26 Claims, 5 Drawing Sheets

THIN FILM TRANSISTOR, MANUFACTURING METHOD THEREOF AND MATRIX CIRCUIT BOARD AND IMAGE DISPLAY DEVICE EACH USING THE SAME

This application is a continuation of application Ser. No. 07/479,173, filed on Feb. 13, 1990, now abandoned.

BACKGROUND OF THE INVENTION

This invention relates to a thin film transistor, a manufacturing method thereof, an active matrix circuit board, and an image display device each using the thin film transistors, and more specifically, to a thin film transistor suitable for reducing manufacturing processes and improving yield of products, a manufacturing method thereof, an active matrix circuit board, and an image display device each using the thin film transistors.

RELATED ART STATEMENT

An amorphous silicon thin film transistor (hereinafter, simply referred to as a-Si TFT) using amorphous silicon (hereinafter, simply referred to as a-Si) as a semiconductor layer has been highlighted as a switching element of an active matrix driven type image display device.

FIG. 1 shows the structures and manufacturing processes of the a-Si TFT which is most popular at present. The structures of the a-Si TFT will be described below with reference to the manufacturing process diagrams of FIG. 1 (A) to FIG. 1 (E).

(a) A gate electrode (first electrode) pattern 2 composed of a metal such as chromium (Cr) or the like on an insulating substrate 1 such as a glass plate or the like.

(b) A silicon nitride film (hereinafter, simply referred to as SiN film) used as a gate insulating film 3, an a-Si film used as a semiconductor thin film (active layer) 4, and an n-type a-Si film 50 doped with phosphorus (P) for contact with electrodes are successively formed by a plasma enhanced chemical vapor deposition (P-CVD) or the like.

(c) The semiconductor film pattern 4 having the n-type a-Si film 50 on the surface thereof is formed by usual photoresist and dry etching processes.

(d) The second electrode 5 acting as a drain electrode and the third electrode 6 acting as a source electrode are formed.

(e) The n-type a-Si film 50 is removed from the channel of a thin film transistor between the second electrode 5 and the third electrode 6 by a dry etching or the like.

The a-Si TFT is completed by the processes as described above and used for an active matrix driven type image display device with the first electrode coupled with the first bus line, the second electrode coupled with the second bus line, and the third electrode coupled with display pixel electrode, respectively, and further with a passivation layer and the like provided therewith.

In the above prior art, the n-type a-Si film 50 having a low resistance must be removed from the channel between the drain electrode 5 and the source electrode 6, as shown in the process of FIG. 1 (E). However, a technology for selectively etching the n-type a-Si film 50 on the a-Si film constituting the semiconductor film pattern 4 is not yet established, and thus the a-Si film 4 as an underlayer is also etched. As a result, defective products produced in this process sometimes cause a large problem. To cope with this problem, the a-Si film 4 is formed to a thickness beyond a requirement and the upper n-type a-Si film 50 is selectively etched anticipating that the underlayer a-Si film 4 is also inevitably etched to some extent, which results in the drawback in that the processes are made complex and yield of products is not good. On the other hand, the a-Si film must be made thin to improve the characteristics of a transistor. Thus, as a method of simplifying the process associated with the n-type a-Si film 50, there is a method proposed by, for example, Japanese Patent Application Kokai (Laid-Open) No. Sho 61-234080, wherein source and drain electrodes are composed of a material containing Group V elements of the periodic table and an impurity layer is formed between the electrodes and an amorphous silicon semiconductor.

Since, however, the electrode material containing impurities, which is used when the process for forming the above n-type a-Si film is omitted, is composed of chromium or silver and contains 0.1% or less of phosphorus, a heat treatment is indispensable after the formation of an electrode pattern to realize a good ohmic contact with an underlayer amorphous silicon interface. When, however, the amorphous silicon is exposed to a high temperature of 250° C. or more, hydrogen contained in the amorphous silicon is released, and thus it cannot be heated to 250° C. or more. It is difficult, however, to stably form an n-type a-Si layer having a good ohmic contact and the function to enable electrons to pass and prevent positive holes from passing in a thin film transistor using a heat treatment effected at 250° C. or less and an electrode material containing phosphorus having a concentration of 0.1% or less, and thus this method cannot be practically used in industries.

SUMMARY OF THE INVENTION

The first aspect of this invention relates to a thin film transistor which does not require the process associated with an n-type a-Si film and have characteristics similar or superior to those of a prior thin film transistor.

The second aspect of this invention relates to a method of manufacturing the thin film transistor according to the first aspect of this invention wherein processes are not complex and manufacturing steps causing various problems in operation are not used.

The third aspect of this invention relates a matrix circuit board using the thin film transistor according to the first aspect of this invention.

The fourth aspect of this invention relates to an image display device using the matrix circuit board according to the third aspect of this invention.

Figure 1A:
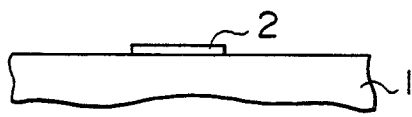
FIGS. 1A–1E are process diagrams explaining prior art.
Figure 1B:
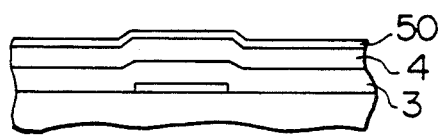
Figure 1C:
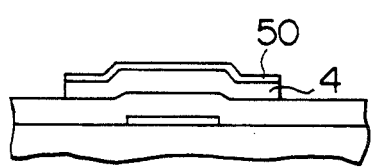
Figure 1D:
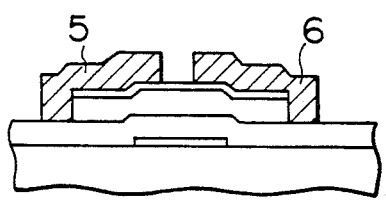
Figure 1E:
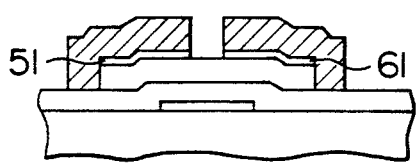

1 insulating substrate (glass plate)
2 first electrode (gate electrode)
3 gate insulating film
4 semiconductor thin film (silicon thin film)
5 second electrode (drain electrode)
6 third electrode (source electrode)
7 display pixel electrode
10 thin film layer containing silicon oxide, or silicon oxide and Group V elements in periodic table
20 polarizer plate
21 color filter
23 counter electrode
24 aligning layer
24 liquid crystal
70 active matrix circuit board
22, 26 passivation layer
40 island-shaped pattern
45 through hole
50, 51, 61 n-type silicon thin film

DETAILED DESCRIPTION OF THE PREFERRED EMBODIMENTS

The first aspect according to this invention relates to a thin film transistor comprising the first electrode pattern formed on an insulating substrate as a gate electrode, the first insulating film formed as a gate insulating film and covering at least the electrode pattern, a semiconductor thin film pattern mainly composed of silicon formed on the insulating film, the semiconductor thin film pattern overlapping the first electrode pattern and the existing region thereof being limited, the second and third electrodes formed on the semiconductor thin film pattern as a drain electrode and a source electrode, the second and third electrodes covering a portion of the semiconductor thin film pattern and being spaced apart each other, and a thin film containing silicon oxide formed over the semiconductor 4, the second and third electrodes being formed upon the silicon oxide film. As a preferable arrangement of the first aspect, at least one kind of Group V elements in the periodic table is contained in the above thin film containing silicon oxide, and as a more preferable arrangement thereof, the above thin film containing silicon oxide has a thickness of 0.5–10 nm, respectively.

The second aspect relates to a method of manufacturing the thin film transistor comprising the processes of forming the first electrode pattern on an insulating substrate serving as a gate electrode, forming the first insulating film serving as a gate insulating film for covering said first electrode pattern serving as said gate electrode, forming an amorphous semiconductor thin film pattern mainly composed of silicon on said gate insulating film, oxidizing the surface film of said amorphous semiconductor thin film pattern to form a thin film containing silicon oxide having the property to enable electrons to pass and prevent positive holes from passing, and forming the second and third electrode patterns serving as a drain electrode and a source electrode through said thin film. As a preferable arrangement of this aspect, there is a method wherein the surface film of the above amorphous semiconductor thin film pattern is oxidized and at least one kind of Group V elements such as, for example, P, Sb and As of the periodic table is contained when the thin film containing silicon oxide is formed in the process of the formation of the above thin film containing silicon oxide. As a more preferable arrangement thereof, there is a method wherein the thin film containing silicon oxide has a thickness of 0.5–10 nm, respectively.

Described below are preferable processes for forming the thin film having the property to enable electrons to pass and prevent positive holes from passing by oxidizing the surface film of the above amorphous semiconductor thin film pattern mainly composed of silicon. As would be apparent to one of ordinary skill in the art, the thin film containing silicon oxide is a tunneling oxide layer (that is, the electrons pass through the thin film by tunneling).

(a) A surface treatment process of the above semiconductor thin film by a water solution containing an oxidation agent (for example, nitric acid, nitrous acid, permanganic acid, chromic acid, hydrogen peroxide, sulfuric acid and the like).

(b) A surface treatment process of the above semiconductor thin film by a water solution containing at least phosphoric acid or a water solution containing at least phosphoric and an oxidation agent. With this process, a silicon oxide film containing phosphorus as a Group V element of the periodic table can be formed.

(c) A surface treatment process of the above semiconductor thin film by hot water having a temperature of 50° C. or more.

(d) A heat treatment process effected in a gas containing at least one kind of $O_2$, $O_3$, $N_2O$, $H_2O$ and $CO_2$ at a temperature of 100° C. to 300° C. A typical example of it is a heat treatment process effected in the atmosphere at the above temperature.

(e) A surface treatment process of the above semiconductor thin film effected by a gas plasma containing at least one kind of $O_2$, $O_3$, $N_2O$, $H_2O$ and $CO_2$.

(f) A surface treatment process of the above semiconductor thin film effected by the gas plasma described in (e) to which a gas containing Group V elements of the periodic table is added. With this process, a silicon oxide film containing the Group V elements of the periodic table can be formed.

The third aspect of this invention relates to an active matrix circuit board comprising a plurality of thin film transistors according to the first aspect of this invention formed on an insulating substrate in a matrix shape, the first bus line interconnecting the first electrodes each serving as a gate electrode for the thin film transistors formed on the same rows, and the second bus line interconnecting the second electrodes each serving as a drain electrode for the thin film transistors formed on the same columns.

The fourth aspect of this invention relates to an image display device comprising the active matrix circuit board according to the third aspect of this invention, a display pixel electrode coupled with the respective third electrodes each serving as a source electrode for the thin film transistors formed on the board, a counter electrode disposed in confrontation with the display pixel electrode, and display cells disposed in the gaps between the display pixel electrode and the counter electrode and having a display material sealed therein which changes the status thereof when voltage is applied thereto.

Although a typical example of the above display material which changes the status thereof by the application of voltage is liquid crystal, a known material such as a plasma discharging gas, fluophor and the like may be used depending on the structure of a display cell in addition to the liquid crystal.

The following conditions must be satisfied to omit the prior process (a film forming process and a process for removing it from a channel) associated with n-type amorphous silicon.

Condition I: A resistance of an amorphous silicon film at a channel must be prevented from being lowered.

Condition II: When an on-signal is applied to a gate electrode, an on-current must be greatly restricted at the interface between amorphous silicon as a semiconductor film and the second and third electrodes.

Condition III: When an off-signal is applied to the gate electrode, positive holes must be prevented from passing through the interface between the amorphous silicon as the semiconductor film and the second and third electrodes.

Since this invention satisfies the above conditions by the manner described below, it is found that characteristics similar or superior to those of a prior amorphous silicon thin film transistor can be obtained even if the process associated with the n-type amorphous silicon is omitted.

Re: Condition I: Since the surface of the channel is covered by a thin film film containing silicon oxide having a resistance higher than that of the amorphous silicon film, a resistance of the channel is not lowered. When a metal film constituting the second and third electrodes is formed, the formation of silicide is prevented by the thin film film containing silicon oxide, and thus the resistance is not lowered by the formation thereof.

Re: Conditions II and III: A thin film film containing silicon oxide acts as an n-type high resistance film. This invention satisfies Conditions II and III by forming this thin film film on the surface of the amorphous silicon film to a very thin thickness of 0.5-10 nm. More specifically, it is considered that when a resistance of the amorphous silicon film is lowered in an on-state, a current flows through the thin film film containing silicon oxide as a tunnel current, whereas when the amorphous silicon film is in a high resistance state in an off-state, the thin film film containing silicon oxide acts as a blocking film against positive holes to make an off-current small. This effect is more increased when a Group V element of the periodic table such as phosphorus is contained to the thin film film containing silicon oxide to enhance the n-type property thereof. Since, however, an excessive instruction of the Group V element lowers a resistance value of the thin film film itself, a proper amount of the element which does not abnormally lower the resistance value is preferably contained. In addition, this effect is preferably obtained when the thin film film containing silicon oxide is formed to a thickness of 0.5-10 nm as described above, and further the thin film film preferably has a thickness of 1.0-3.0 nm from the view point of making manufacturing processes easy and the characteristics of a thin film transistor.

Note that although the composition of silicon oxide represented by a general formula is SiOx, wherein x satisfies the equation $1.5 \leq x \leq 2$, in many cases, it is actually a mixture of SiOx, wherein x satisfies the equation $x=1$ and $x=2$, that is, a mixture of SiO and $SiO_2$ or a mixture system of SiOx which simultaneously contain several values of x (in this case, $0 \leq x \leq 2$). It may be of course $SiO_2$ only, wherein x satisfies the equation $x=2$. Note that, since the above thin film film containing silicon oxide according to this invention has the property to enable electrons to pass and prevent positive holes from passing, it is considered that a thin film transistor having characteristics similar or superior to those of a prior thin film transistor can be provided regardless of that it can be manufactured by a simple manufacturing process.

EMBODIMENTS

Embodiment 1

An embodiment of this invention will be described below with reference to FIG. 2 to FIG. 4.

Figure 2A:
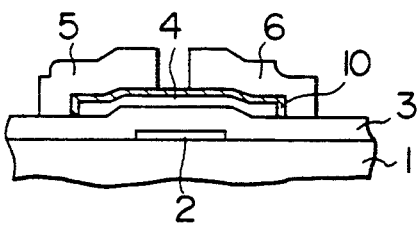
FIGS. 2A and 2B are cross sectional views of a thin film transistor showing an embodiment according to this invention.
Figure 2B:
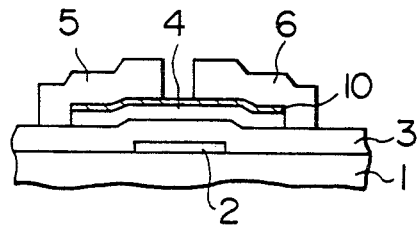
Figure 2C:
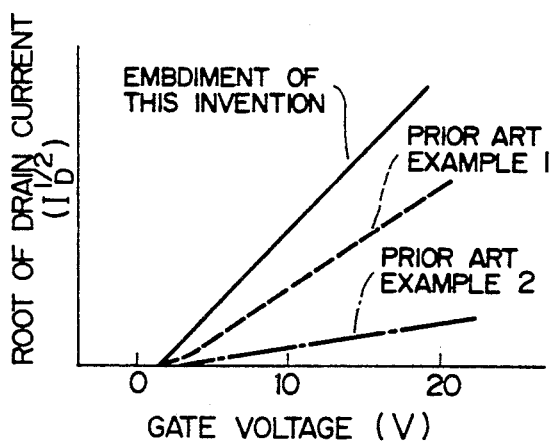
FIG. 2C shows characteristics of the thin film transistors.
Figure 4A:
Figure 4B:

FIGS. 2(A) and (B) show cross sectional views of an example of a thin film transistor to which this invention is applied and FIG. 2(C) shows a characteristic curve of a drain current $I_D^{\frac{1}{2}}$ to a gate voltage. FIG. 3 shows manufacturing processes of the thin film transistor shown in FIG. 2(A) and FIG. 4 shows manufacturing processes of the thin film transistor shown in FIG. 2(B).

In FIGS. 2(A) and (B), 1 designates an insulating substrate such as a glass plate or the like, 2 designates the first electrode acting as a gate electrode, 3 designates a gate insulating film, 4 designates a thin film pattern mainly composed of silicon and acting as a semiconductor film, 5 designates the second electrode acting as a drain electrode, 6 designates the third electrode acting as a source electrode, and 10 designates a thin film film containing silicon oxide or a thin film film containing silicon oxide and a Group V element of the periodic table each formed on a thin film surface mainly composed of silicon.

The manufacturing processes of the thin film transistors will be described below with reference to FIGS. 3 (A)–(E) and FIGS. 4(A)–(E).

Note that, the figures common to FIGS. 3 and 4 such as, for example, process diagrams (a) and (b) will be described without indicating the figure number thereof and only the figures not common to them will be described with the respective numbers thereof.

(a): A metal film such as a chromium film or the like is formed on the insulating substrate 1 such as the glass plate or the like by sputtering or the like and the first electrode pattern 2 acting as the gate electrode is formed using a usual photo etching process.

(b): An insulting film such as a silicon nitride film or the like used as the gate insulating film and the undoped amorphous silicon film 4 used as the semiconductor film are formed by a plasma enhanced CVD.

Figure 3A:
FIGS. 3A–3E, 4A–4E and 6A–6F are diagrams of an embodiment showing manufacturing processes of the thin film transistor according to this invention.
Figure 3B:
Figure 3C:
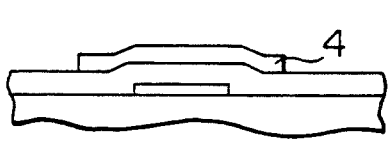

(c): In the case of the thin film transistor shown in FIG. 2(A), an island pattern 40 composed of an amorphous silicon film is formed using usual photoresist and dry etching processes, as shown in FIG. 3(C).

Figure 4C:
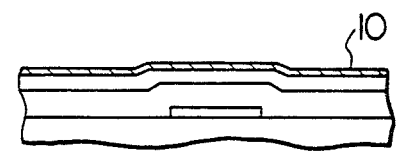
Figure 3D:
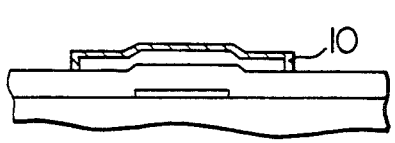

In the case of the thin film transistor shown in FIG. 2(B), the substrate is immersed in a treatment solution of 40° C. composed of nitric acid, acetic acid and water and a small amount of phosphoric acid for one minute and the thin film film 10 containing silicon oxide (SiOx, where x satisfies the equation $1.5 \leq x \leq 2$) and a small amount of phosphorus (P) is formed on the surface film of the amorphous silicon film 4, as shown in FIG. 4(C).

(d): In the case of the thin film transistor shown in FIG. 2(A), the substrate is immersed in a treatment solution of 40° C. composed of nitric acid, acetic acid and water and a small amount of phosphoric acid for one minute and the thin film film 10 containing silicon oxide (SiOx, where x satisfies the equation $1.5 \leq x \leq 2$) and a small amount of phosphorus (P) is formed on the surface film of the amorphous silicon film 4, as shown in FIG. 2(D).

Figure 4D:
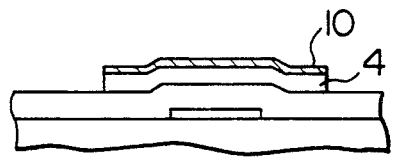
Figure 3E:
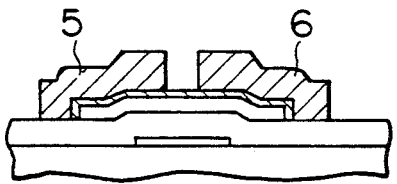
Figure 4E:
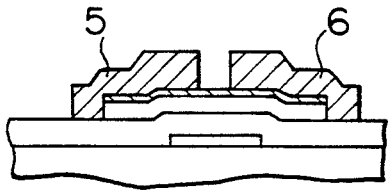

In the case of the thin film transistor shown in FIG. 2(B), an island pattern 40 composed of an amorphous silicon film having the thin film 10 is formed on the surface film thereof using usual photoresist and dry etching processes, as shown in FIG. 4(D).

(e): A metal film such as an aluminum (Al) film or the like is formed using sputtering or the like and the second and third electrodes 5 and 6 acting as the drain electrode or the source electrode are formed.

The thin film transistors shown in FIGS. 2(A) and (B) are completed as described above. FIG. 2(C) shows the characteristics of the thus manufactured thin film transistors. FIG. 2(C) shows the characteristics by the relationship between a drain current $I_D^{\frac{1}{2}}$ and a gate voltage. A prior example 1 shows the result of the thin film transistor shown in FIG. 1 and a prior example 2 shows the result of the thin film transistor shown in FIG. 1 which is not provided with n-type amorphous silicon films 51 and 61. The thin film transistor according to this invention exhibits the largest effective mobility of which value is about twice that of the prior example 1 and about fifty times that of the prior example 2. Further the thin film transistor according to this invention exhibits the lowest value of a threshold voltage.

This invention is applied to the process (d) shown in FIG. 3 and the process (c) shown in FIG. 4 by which the thin film film 10 containing silicon oxide and phosphorus shown in FIGS. 2(A) and (B) is formed. When a thickness of the above thin film film containing silicon oxide is assumed by a polarizing analysis method (ELPISO) using an X-ray photoelectron spectral analysis and X-ray photoelectron spectroscopy ellipsometry, it is estimated to be 1.2–1.5 nm. Since this thin film film has a high resistance, when the thickness is 3 nm or more, a substantial resistance comes to exist between the electrodes (5) and (6), and, more over, when it is 10 nm or more, an on-current is more restricted even if compared with a thin film transistor manufactured by prior art. When the film thickness is 1 nm or less, the aluminum (Al) constituting the electrodes 5 and 6 is susceptible to react with amorphous silicon and thus the on-current is restricted and an off-current tends to increase. Consequently, the thin film film containing silicon oxide and phosphorus preferably has a thickness of 0.5–10 nm and more preferably has a thickness in the range from 1.0 nm to 3.0 nm, although this thickness depends on treating conditions.

Embodiment 2

Figure 5:
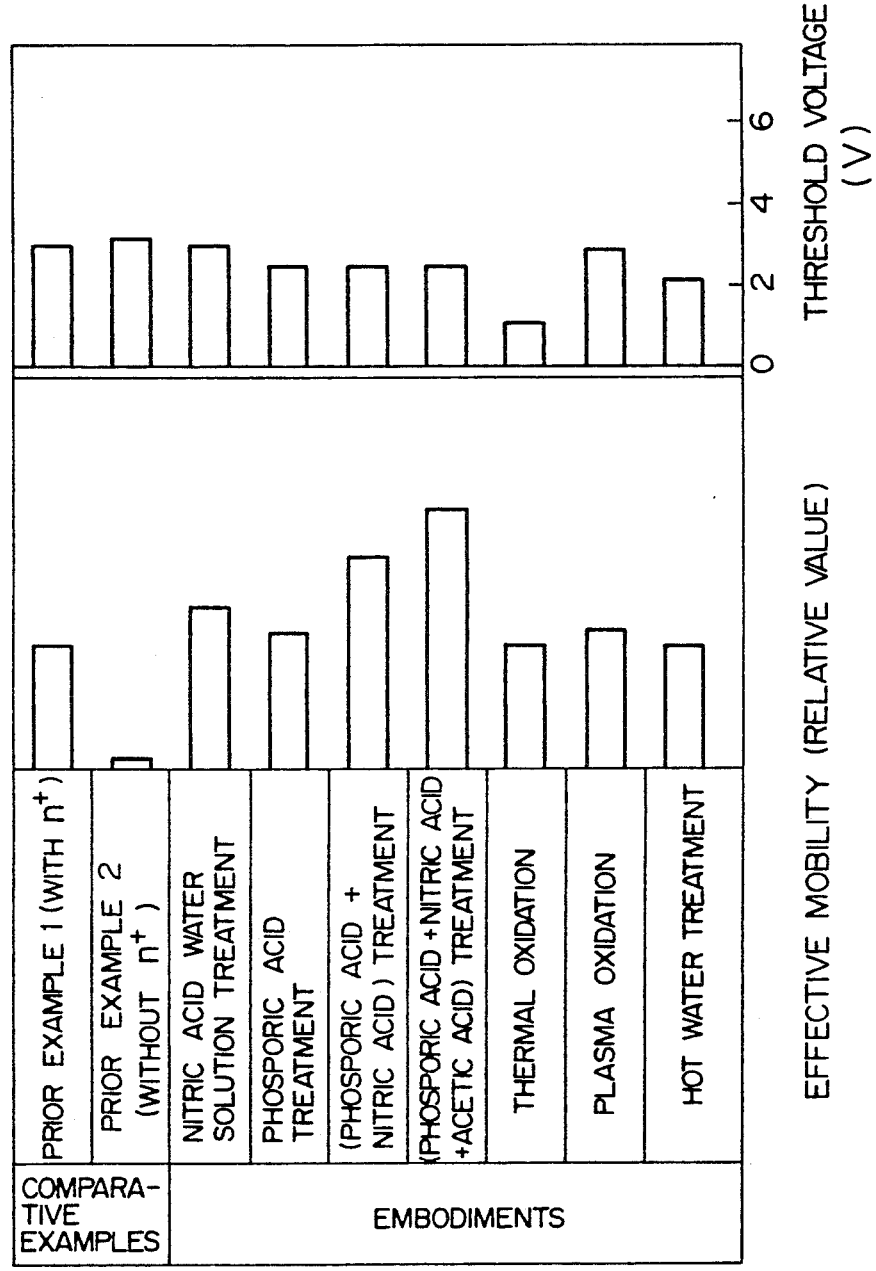
FIG. 5 is a graph showing the effect of this invention.

In the embodiment 1, this invention is applied to the process (d) of FIG. 3 and the process (c) of FIG. 4. A thin film transistor is manufactured by the processes shown in FIG. 3, and FIG. 5 shows the result of investigation of the relationship between a surface treatment method of an amorphous silicon film effected in the process (d) and the effective mobility and threashold voltage of the thin film transistor. A prior example 1 shows the result of a thin film transistor making an electric contact by usual n-type amorphous silicon and a prior example 2 shows the result of the thin film transistor from which an n-type amorphous silicon film is removed. An effective mobility of the prior example 1 is 0.3 $cm^2/v \cdot s$ in this case. The surface treatment of the amorphous silicon film in the process (d) of FIG. 3 was carried out for only the purpose of oxidation and for the purpose of oxidation and addition of phosphorus.

The treatment aiming at only the formation of an oxidation film includes treatments by a nitric acid water solution, thermal oxidation, plasma oxidation treatment, and hot water. The conditions for each treatment is as follows.

Treatment by nitric acid water solution: The result of a sample immersed in a nitric acid water solution having a concentration of 20% for one minute is shown.

Treatment by thermal oxidation: A case in which the treatment by thermal oxidation was carried out in the atmosphere at a temperature of 200° C. for 30 minutes is shown. In this embodiment, the thermal oxidation was carried out at a temperature of 300° C. or less at which less hydrogen is released from the amorphous silicon film. The atmosphere may be an oxidation atmosphere.

Treatment by plasma oxidation: A case in which a sample was exposed to oxygen plasma for 5 minutes is shown. In this embodiment, plasma for carrying out the surface treatment of the amorphous silicon film may include a gas containing oxygen such as, for example, $O_2$, $O_3$, $N_2O$, $H_2O$, $CO_2$ or the like.

Treatment by hot water: A case in which a sample is immersed in hot water of 70° C. for one minute is shown. This effect can be obtained when hot water of 50° C. or more is used.

When an object is to form a thin film film containing phosphorus and silicon oxide, a treatment by phosphoric acid, a treatment by the water solution containing phosphoric acid and nitric acid, and a treatment by a water solution containing nitric acid and acetic acid and a small amount of phosphoric acid are used. Although these treatments were carried out at a temperature of 40° C., it may be carried out at a room temperature. It is found from FIG. 5 that the thin film transistors subjected to the above surface treatment of the amorphous silicon film exhibits characteristics similar or superior to those of the thin film transistor (prior example 1) shown as the prior comparative example. In particular, the thin film transistor subjected to the treatment by the water solution containing phosphoric acid and an oxidation agent exhibits characteristics superior to those of the prior example 1. The same effect can be obtained by adding a gas containing a Group V element such as, for example, $PH_3$, $AsH_3$ or the like to a gas constituting plasma in the treatment by plasma oxidation. Although FIG. 5 shows nothing regarding an off-current, it has characteristics similar or superior to those of the prior example 1.

Embodiment 3

FIGS. 6(A)–(F) show the third embodiment of a method of manufacturing the thin film transistor according to this invention. They show a case in which a passivation layer for a channel is formed and then the second and third electrodes are formed through through holes created to the passivation layer. The method will be described below according to the sequence of processes.

(a) A metal film such as a chromium film or the like is formed on an insulating substrate 1 such as the glass plate or the like by sputtering or the like and a gate electrode pattern is formed using a usual photo etching process.

(b): An insulting film such as a silicon nitride film or the like used as a gate insulating film 3, an undoped amorphous silicon film 4 used as a semiconductor film, and an insulating thin film such as a silicon nitride film or the like used as a passivation layer 26 are formed by a plasma CVD.

(c) The gate insulating film 3, the semiconductor film 4 and an island-shaped pattern 40 composed of the passivation layer 26 are formed by usual photoresist and dry etching processes.

(d): The through holes 45 are created using a usual photo etching process to form the second and third electrodes in the passivation layer.

(e) The substrate is immersed in a water solution containing phosphoric acid and nitric acid for one minute and then a thin film film containing silicon oxide and a small amount of phosphorus is formed.

(f): A metal film of such as aluminum or the like is formed by sputtering or the like and the second electrode 5 and the third electrode 6 acting as a drain electrode or a source electrode is formed.

The above processes enable the thin film transistor to be manufactured without exposing the surface of a channel to the atmosphere. Characteristics similar or superior to those of a prior thin film transistor also can be obtained in this case by the introduction of the process (e) according to this invention even if the process associated with n-type amorphous silicon is omitted. The various surface treatments shown in the second embodiment are also applicable to the process (e) in this case.

Embodiment 4

Figure 6A:
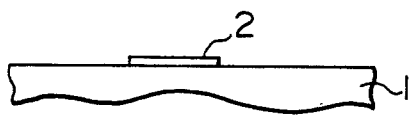
Figure 6B:
Figure 6C:
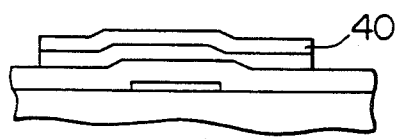
Figure 6D:
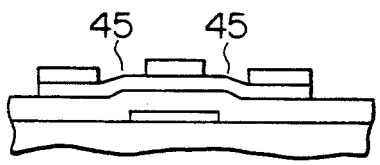
Figure 6E:
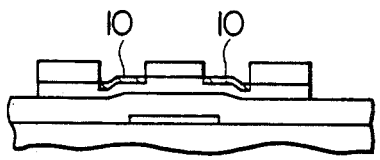
Figure 6F:
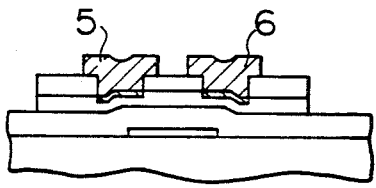
Figure 7A:
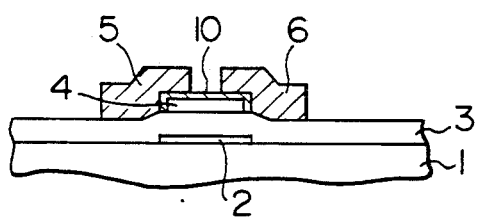
FIGS. 7A and 7B are cross sectional views of a thin film transistor showing another embodiment according to this invention.
Figure 7B:
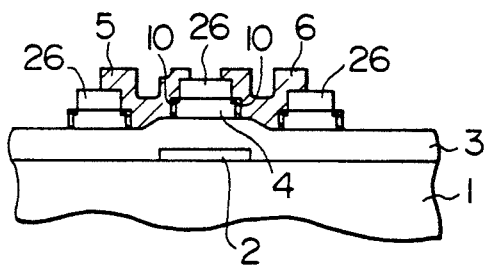

FIGS. 7(A) and (B) show the fourth embodiment. FIG. 7(A) shows the case in which the semiconductor film 4 shown in FIG. 1(A) is projected inward over a distance greater than the thickness of the semiconductor film from the edge of a gate electrode 2. Further, FIG. 7(B) shows the case in which the semiconductor film 4 shown in FIG. 6(B) is projected inward over a distance greater than the thickness of the semiconductor film from the edge of a gate electrode 2. The example shown in FIG. 7(A) can be manufactured by the manufacturing processes shown in FIG. 2 and the example shown in FIG. 7(B) can be manufactured by the manufacturing processes shown in FIG. 6. This embodiment enables the on-characteristics of a thin film transistor to be improved and in particular a large on-current to be taken even if the process associated with an n-type amorphous silicon film is omitted. Although a prior amorphous silicon thin film transistor usually has the effective mobility of about 0.3-0.5 $cm^2/V \cdot s$, the thin film transistor of this embodiment can take the effective mobility of about 1 $cm^2/V \cdot s$. In particular, the characteristics of the thin film transistor having the structure shown in FIG. 7(A) is greatly improved.

Embodiment 5

Figure 8A:
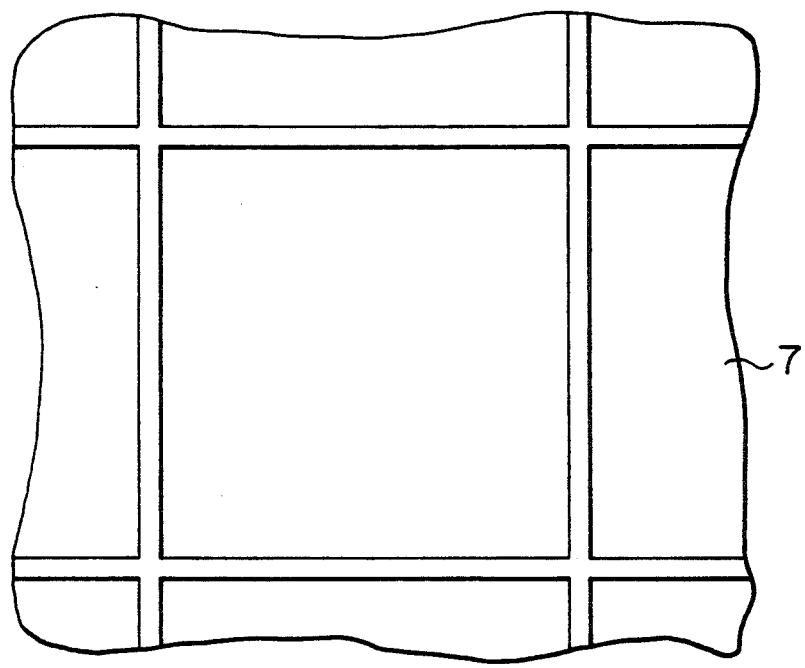
FIG. 8(A) is a plan view showing an embodiment on a liquid crystal display device according to this invention.
Figure 8B:
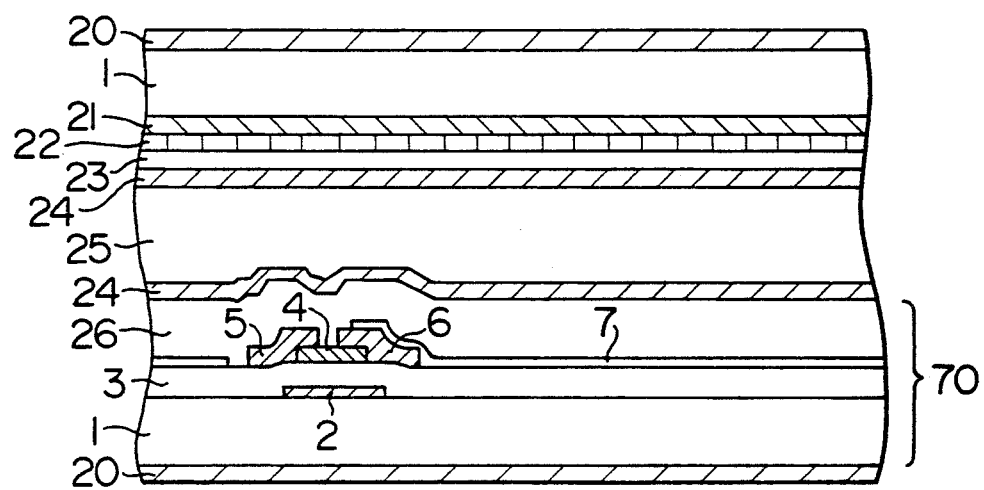
FIG. 8(B) is a cross sectional view of the liquid crystal display device.

FIG. 8 shows a main part of an embodiment of an image display device according to this invention comprising a liquid crystal display device utilizing an active matrix circuit board 70 constituted by a usual method using amorphous silicon thin film transistors shown in FIG. 7(A). FIG. 8(A) shows a plan view of the image display unit and FIG. 8(B) shows a cross sectional view thereof.

In FIG. 8(B), 70 designates the active matrix board using the amorphous silicon thin film transistors shown in FIG. 7(A) wherein a multiplicity of the thin film transistors are arranged along the rows and columns of an X-Y matrix although omitted in the figure and the first electrodes 2 serving as adjacent gate electrodes are coupled with a gate bus line and the third electrodes 5 serving as drain electrodes are coupled with a drain bus line. On the other hand, the third electrodes 6 serving as source electrodes are coupled with a display pixel electrode 7, respectively. Numeral 20 designates a polarizer; 21 designates a color filter; 23 designates a counter electrode confronting the display pixel electrode 7 composed of a transparent conductive film and is also composed of a transparent conductive film; 22 and 26 designate a passivation layer, respectively; 24 designates an orientation film; and 25 designates liquid crystal sealed in the vacant space of a cell.

This example of the image display device constructed as described above is used for displaying a color picture. Further, this display device can be easily manufactured by a manufacturing process similar to that of a well-know color liquid crystal display device.

Note that, although a practical display device is provided with various electric circuit control systems as a well-known image display drive means and an illuminating means from the back surface of the device in addition to the arrangement shown in FIG. 8, these means are omitted here.

According to this invention, since characteristics similar or superior to those of a prior thin film transistor can be obtained even if the process associated with an n-type silicon thin film used for an electric contact of source electrodes and drain electrodes, there is an advantage in that the number of manufacturing processes can be reduced and defective products made in the process associated with the n-type silicon thin film (a film forming and processing process) are eliminated.

Consequently, in the manufacture of the active matrix circuit board comprising the thin film transistors according to this invention and the image display device constituted using them, the number of processes are reduced and a high production yield is realized, whereby this invention greatly contributes to the development of this technical field.

What is claimed is:
1. A thin film transistor, comprising:
   a first electrode pattern as a gate electrode provided on an insulating substrate;
   a first insulating film as a gate insulating film provided on said first electrode pattern and a part of said insulating substrate;
   a semiconductor thin film pattern mainly composed of silicon and provided on a part of said first insulating film, said semiconductor thin film pattern spatially overlapping said first electrode pattern and having a thin silicon oxide layer which contains silicon oxide and which is provided on a surface of at least a part of said semiconductor thin film pattern, said thin silicon oxide layer being a tunneling oxide layer; and
   second and third electrodes respectively formed on said thin silicon oxide layer as a drain electrode and a source electrode, said second and third electrodes being spaced apart from each other.
2. An active matrix circuit board, comprising:

a plurality of thin film transistors according to claim 1, which are formed on said insulating substrate in a matrix shape;

a first bus line interconnecting said first electrodes of some of said plurality of thin film transistors to be formed on the same rows; and a second bus line interconnecting one of said second electrodes and said third electrodes in some of said plurality of thin film transistors to be formed on the same columns.

3. An image display device, comprising:

the active matrix circuit board according to claim 2;

display pixel electrodes respectively coupled to the other of said second electrodes and said third electrodes;

a common electrode formed in confrontation with said display pixel electrodes; and display cells respectively disposed in the gaps between said display pixel electrodes and said common electrode and respectively having display material sealed therein which changes the status thereof when voltage is applied thereto.

4. A thin film transistor according to claim 1, wherein said second and third electrodes are provided above said first electrode pattern.

5. A thin film transistor according to claim 1, wherein a width of said semiconductor thin film pattern is narrower than that of said first electrode pattern by at least a thickness of said semiconductor thin film pattern.

6. A thin film transistor according to claim 1, wherein said thin silicon oxide layer is provided by performing surface treatment for a semiconductor layer including said semiconductor thin film pattern, prior to forming of said second and third electrodes.

7. A thin film transistor according to claim 6, wherein said thin silicon oxide layer has a resistivity greater than that said semiconductor thin film pattern.

8. A thin film transistor according to claim 1, wherein said thin silicon oxide layer passes electrons and prevents positive holes from passing.

9. A thin film transistor according to claim 1, wherein said thin silicon oxide layer covers surfaces of said semiconductor thin film pattern except for a portion where said semiconductor thin film pattern contacts with said first insulating film.

10. A thin film transistor according to claim 1, wherein said thin silicon oxide layer covers surface of said semiconductor thin film pattern, except for a portion where said semiconductor thin film pattern contacts with said first insulating film, and except for a portion where at least one of said second and third electrodes extends to directly contact with said semiconductor thin film pattern.

11. A thin film transistor according to claim 1, wherein the second and third electrodes are positioned such that current passing between the second electrode and the semiconductor thin film pattern, and between the third electrode and the semiconductor thin film pattern, when the transistor is in an on-state, passes through the thin silicon oxide layer.

12. A thin film transistor according to claim 11, wherein the thin silicon oxide layer is adapted to act as a blocking film against positive holes so as to make a current, when the transistor is in an off-state, relatively small.

13. A thin film transistor according to claim 1, wherein the thin silicon oxide layer is provided directly in contact with the semiconductor thin film pattern; and each of the second and third electrodes are provided directly in contact with the thin silicon oxide layer, at locations overlying the first electrode pattern.

14. A thin film transistor according to claim 1, wherein said thin silicon oxide layer is a layer formed by a surface oxidation process of a semiconductor layer so as to form said thin silicon oxide layer and said semiconductor thin film pattern.

15. The thin film transistor according to claim 1, wherein said silicon oxide is represented by SiOx (wherein x satisfies the equation $1.5 \leq x \leq 2$).

16. The thin film transistor according to claim 15, wherein said thin film containing silicon oxide contains at least one element selected from the group consisting of Group V elements of the periodic table.

17. The thin film transistor according to claim 1 wherein said thin film containing silicon oxide has a thickness of 0.5-10 nm.

18. The thin film transistor according to claim 16, wherein the at least one element is selected from the group consisting of P, Sb and As.

19. The thin film transistor according to claim 18, wherein the at least one element is P.

20. The thin film transistor according to claim 17, wherein the thin film containing silicon oxide has a thickness of 1.0-3.0 nm.

21. The thin film transistor according to claim 1, wherein the second and third electrodes are provided upon the thin silicon oxide layer such that the thin silicon oxide layer is provided between the semiconductor thin film pattern and the second and third electrodes.

22. The thin film transistor according to claim 21, wherein the thin silicon oxide layer is provided such that there is substantially no direct contact between the semiconductor thin film pattern and the second and third electrodes.

23. The thin film transistor according to claim 1, further comprising a passivating film provided on the semiconductor thin film pattern, said passivating film having through-holes therethrough to the semiconductor thin film pattern, said thin silicon oxide layer being provided in said through-holes, with said second and third electrodes being formed upon said thin silicon oxide layer in said through-holes.

24. The thin film transistor according to claim 1, wherein said second and third electrodes overlie the first electrode pattern as a gate electrode.

25. The thin film transistor according to claim 1, wherein the semiconductor thin film pattern is made of an amorphous semiconductor.

26. The thin film transistor according to claim 25, wherein the amorphous semiconductor is amorphous silicon.

* * * * *